United States Patent
Woo et al.

(10) Patent No.: US 9,627,389 B1
(45) Date of Patent: Apr. 18, 2017

(54) METHODS TO FORM MERGED SPACERS FOR USE IN FIN GENERATION IN IC DEVICES

(71) Applicant: GLOBALFOUNDRIES Inc., Grand Cayman (KY)

(72) Inventors: Youngtag Woo, San Ramon, CA (US); Lei Yuan, Cupertino, CA (US); Srinivasa Banna, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/003,304

(22) Filed: Jan. 21, 2016

(51) Int. Cl.
   *H01L 21/311* (2006.01)
   *H01L 27/11* (2006.01)
   *H01L 29/66* (2006.01)

(52) U.S. Cl.
   CPC ...... *H01L 27/1104* (2013.01); *H01L 29/6653* (2013.01); *H01L 29/6656* (2013.01); *H01L 29/66545* (2013.01)

(58) Field of Classification Search
   USPC .......................................................... 438/702
   See application file for complete search history.

(56) References Cited

U.S. PATENT DOCUMENTS

| 8,835,328 B2* | 9/2014 | Hwang | H01L 29/66795 438/694 |
| 2014/0099792 A1* | 4/2014 | Bergendahl | H01L 21/3086 438/696 |
| 2015/0162339 A1* | 6/2015 | Divakaruni | H01L 21/0234 257/321 |
| 2016/0071771 A1* | 3/2016 | Colburn | H01L 21/82343 438/283 |

* cited by examiner

*Primary Examiner* — Timor Karimy
(74) *Attorney, Agent, or Firm* — Ditthavong & Steiner, P.C.

(57) ABSTRACT

Methods to utilize efficient processes to form and use merged spacers in fin generation and the resulting devices are disclosed. Embodiments include providing mandrels separated from each other across two adjacent bit-cells on an upper surface of a dielectric layer on an upper surface of a silicon (Si) layer; forming first spacers on opposite sides of each mandrel; forming second spacers on exposed sides of the first spacers; removing the mandrels; removing exposed sections of the dielectric layer; removing the first and second spacers; forming fin-spacers on opposite sides of remaining sections of the dielectric layer; removing the remaining sections of the dielectric layer; removing exposed sections of the Si layer; and removing the fin-spacers to reveal Si fins.

20 Claims, 14 Drawing Sheets

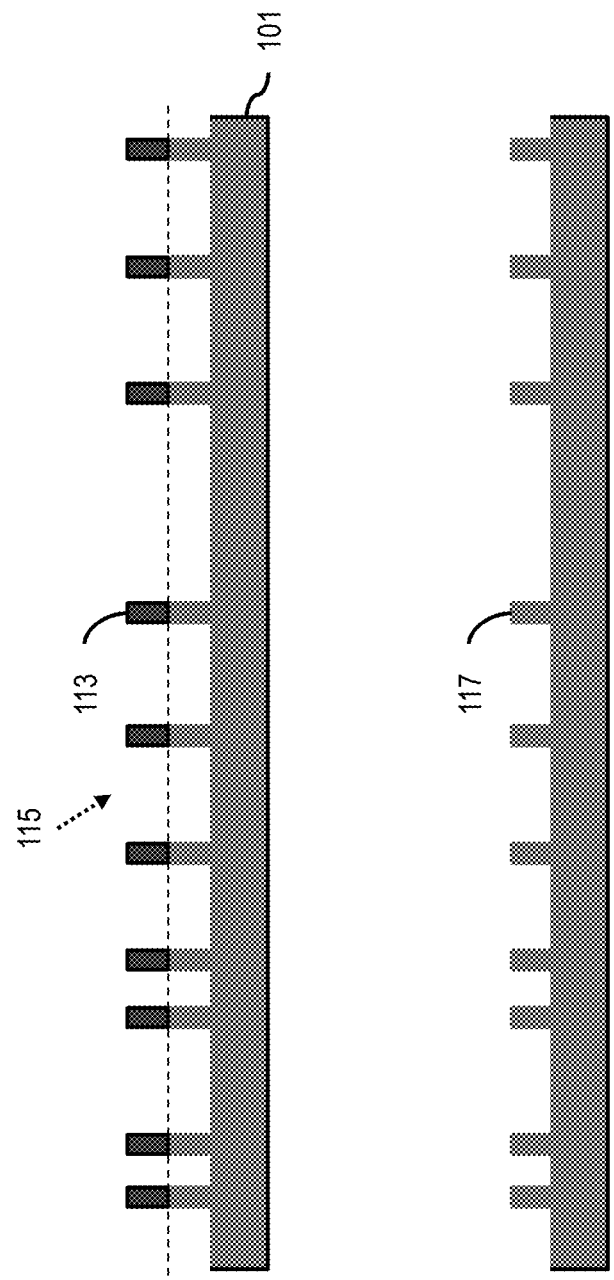

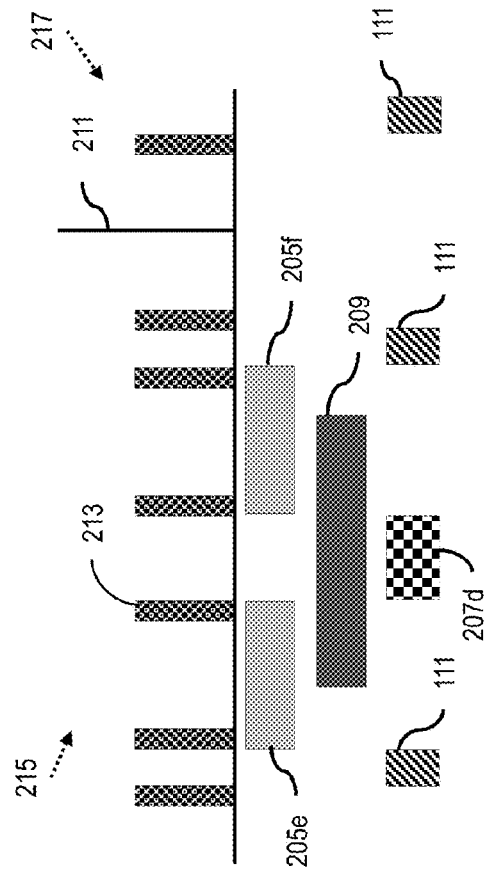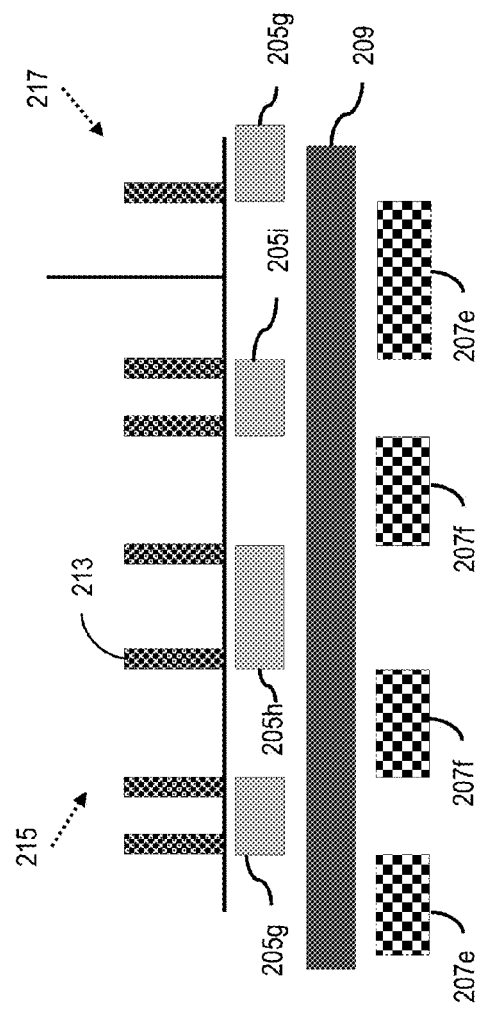
FIG. 2D
FIG. 2E

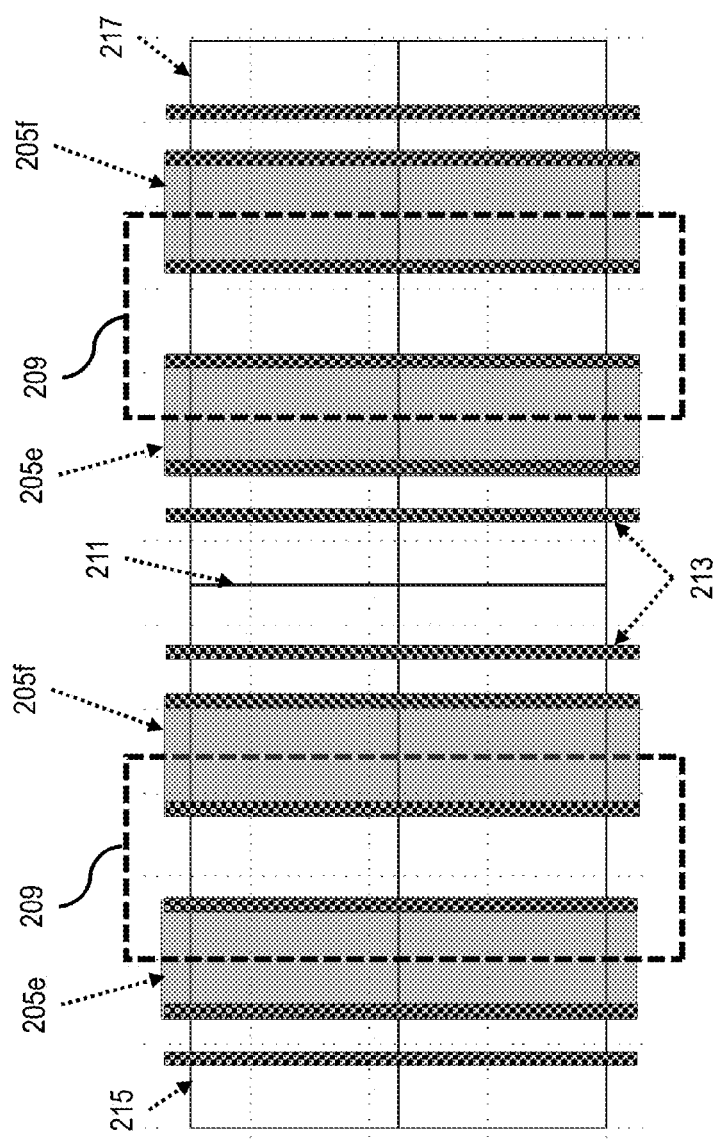

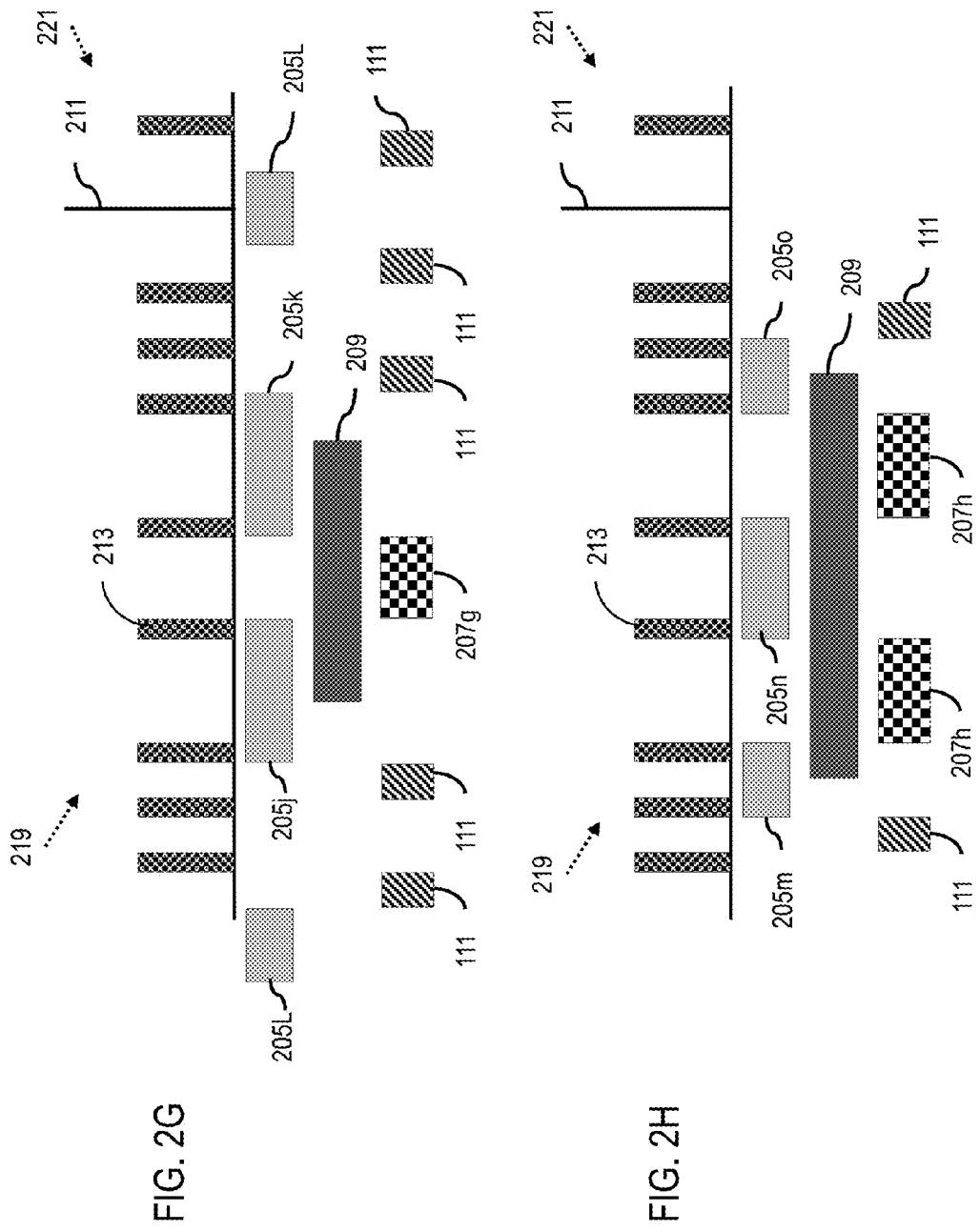

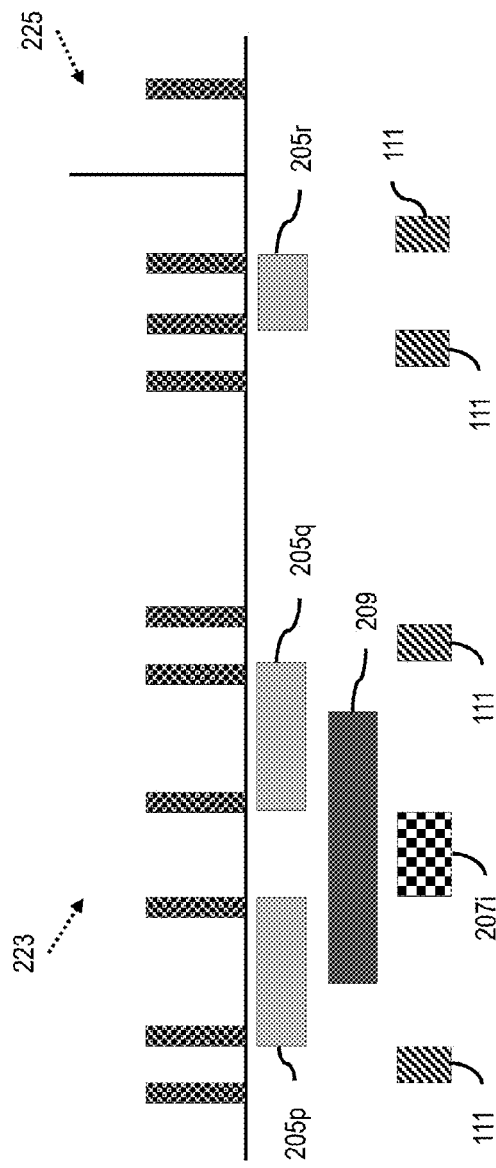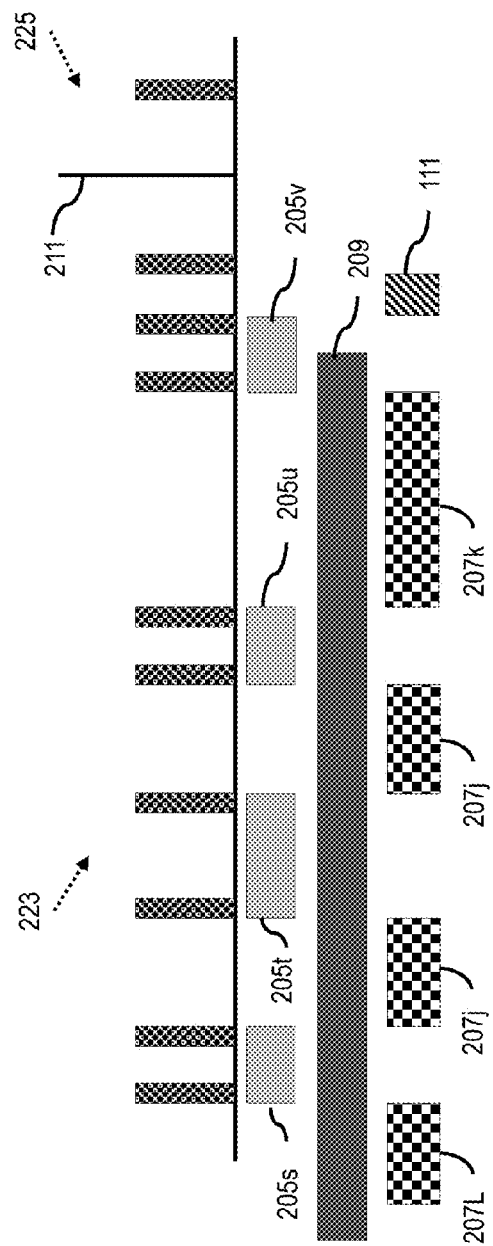

METHODS TO FORM MERGED SPACERS FOR USE IN FIN GENERATION IN IC DEVICES

TECHNICAL FIELD

The present disclosure relates generally to designing and fabricating integrated circuit (IC) devices. The present disclosure is particularly applicable to forming fins for a static random access memory (SRAM) bit-cell for 7 nanometer (nm) technology node and beyond.

BACKGROUND

Generally, various advanced processes may be utilized in design and fabrication of IC devices, particularly to aid with forming components/structures having reduced geometries for higher IC devices. In scaling of fin-type devices, a smaller fin-pitch (FP) may be utilized. However, in smaller technology nodes (e.g., 7 nm or smaller), it is challenging to utilize traditional methods, such as using lithography masks, to form or remove fins. For instance, in forming fins (e.g., fin width of 7 nm) in an SRAM bit-cell, limitations of a lithography process may cause geometrical variations in the fins impacting manufacturing yield and device performance.

Therefore, a need exists for a methodology enabling efficient processes to form and utilize merged spacers in fin generation.

SUMMARY

An aspect of the present disclosure is a method of enabling efficient processes to form and use merged spacers in fin generation.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing mandrels separated from each other across two adjacent bit-cells on an upper surface of a dielectric layer on an upper surface of a silicon (Si) layer; forming first spacers on opposite sides of each mandrel; forming second spacers on exposed sides of the first spacers; removing the mandrels; removing exposed sections of the dielectric layer; removing the first and second spacers; forming fin-spacers on opposite sides of remaining sections of the dielectric layer; removing the remaining sections of the dielectric layer; removing exposed sections of the Si layer; and removing the fin-spacers to reveal Si fins.

An additional aspect includes providing consecutively first and second mandrels in each of the two adjacent bit-cells, wherein the first and second spacers fill a space between the first and second mandrels of each bit-cell. In one aspect where two dummy Si fins are formed in a space between the second mandrel of the first bit-cell and first mandrel of the adjacent bit-cell, a cut-mask is utilized to remove the two dummy Si fins.

Another aspect includes providing a first mandrel in each of the two adjacent bit-cells and a second mandrel extending across a boundary of the two adjacent bit-cells; and forming the first and second spacers filling a space between the first and second mandrels.

One aspect includes providing consecutively first, second, and third mandrels in each of the two adjacent bit-cells, wherein a space between the third mandrel of the first bit-cell and the first mandrel of the second bit-cell is greater than each space between the first and second mandrels and between the second and third mandrels of each bit-cell, and wherein the first and second spacers fill each space.

According to the present disclosure some technical effects may be achieved in part by a method including providing mandrels separated from each other across two adjacent bit-cells on an upper surface of a dielectric layer on an upper surface of a Si layer; forming first spacers on opposite sides of each mandrel; removing a subset of the first spacers, exposing sides of a subset of the mandrels; forming second spacers on each exposed side of the subset of the mandrels and adjacent to exposed sides of the first spacers; removing the mandrels; removing exposed sections of the dielectric layer; removing the first and second spacers; forming fin-spacers on opposite sides of remaining sections of the dielectric layer; removing the remaining sections of the dielectric layer; removing exposed sections of the Si layer; and removing the fin-spacers to reveal Si fins.

One aspect includes removing the subset of spacers by forming a block mask with openings over the subset of spacers.

A further aspect includes providing first and second mandrels in each of the two adjacent bit-cells; and forming the block mask covering a space between the first and second mandrels of each bit-cell.

An additional aspect includes providing first and second mandrels in each of the two adjacent bit-cells and a third mandrel extending over a boundary between the two adjacent bit-cells; forming the block mask covering a space between the first and second mandrels of each bit-cell; and forming the first and second spacers filling a space between the first and second mandrels. In one aspect, dummy Si fins are formed on opposite sides of the boundary.

A further aspect includes providing consecutively first, second, and third mandrels in each of the two adjacent bit-cells; forming the block mask covering spaces between the first and second mandrels and between the second and third mandrels of each bit-cell; and forming the first and second spacers filling the spaces between the first and second mandrels and between the second and third mandrels of each bit-cell.

Another aspect includes providing consecutively first, second, and third mandrels in the first bit-cell and third, second, and first mandrels in the second bit-cell; forming the block mask covering a space between the first and second mandrels of each bit-cell; and forming the first and second spacers filling the spaces between the first and second mandrels of each bit-cell. In a further aspect, two dummy Si fins are formed on opposite sides of a boundary between the two adjacent bit-cells.

One aspect includes providing consecutively first second, third, and fourth mandrels in the first bit-cell and fourth, third, second, and first mandrels in the second bit-cell; forming the block mask with an opening over a side of the fourth mandrel adjacent a boundary between the two adjacent bit-cells; and forming the first and second spacers filling spaces between the first and second mandrels, between the second and third mandrels, and between the third and fourth mandrels of each bit-cell.

A further aspect includes providing consecutively first, second, third, and fourth mandrels in the first bit-cell and fourth, third, second, and first mandrels in the second bit-cell; forming the block mask with an opening over a side of the fourth mandrel adjacent a boundary between the two adjacent bit-cells; and forming the first and second spacers filling spaces between the first and second mandrels and between the second and third mandrels, but not filling a space between the third and fourth mandrels of each bit-cell. In one aspect, two dummy Si fins are formed in the space between the third and fourth mandrels of each bit-cell. Another aspect includes utilizing a cut-mask to remove the two dummy Si fins in the space between the third and fourth mandrels of each bit-cell.

An additional aspect includes providing consecutively first, second, and third mandrels in the first bit-cell and third, second, and first mandrels in the second bit-cell; forming the block mask over a space between the first and second mandrels and over a side of the third mandrel remote from a boundary between the two adjacent bit-cells; and forming the first and second spacers filling only the space between the first and second mandrels of each bit-cell.

In another aspect, a dummy Si fin is formed in a space between the second mandrel and the third mandrel of each bit-cell, the method includes utilizing a cut-mask to remove the dummy Si fin in the space between the second mandrel and the third mandrel of each bit-cell.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A through 1K illustrate a process for using merged spacers in generating Si fins for memory bit-cells, in accordance with an exemplary embodiment.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of variations and inaccuracies attendant upon lithographically forming Si fins in an IC device for advanced technology nodes. The present disclosure addresses and solves such problems, for instance, by, inter alia, utilizing efficient processes to form and use merged spacers in fin generation.

FIGS. 1A through 1K illustrate a process for using merged spacers in generating Si fins for memory bit-cells, in accordance with an exemplary embodiment.

Figure 1A:
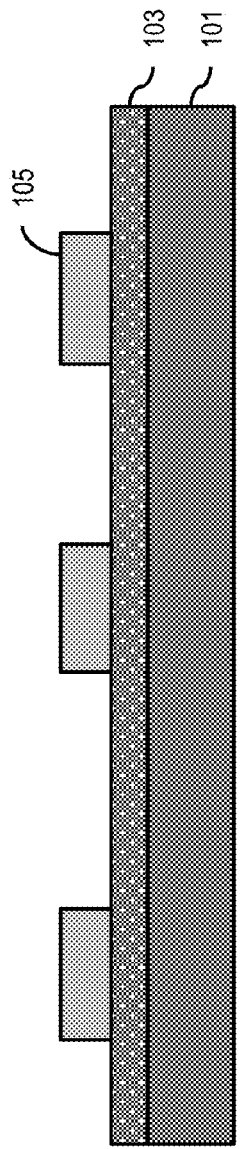

FIG. 1A illustrates a Si substrate 101, a dielectric layer 103 on an upper surface of the Si layer 101, and mandrels 105 separated from each other, on an upper surface of the dielectric layer 103. The position and number of the mandrels 105 may vary according to a design and fabrication of a target device such as a memory cell, which may be adjacent to another memory cell (e.g., in a 2×2 SRAM memory cell).

Figure 1B:
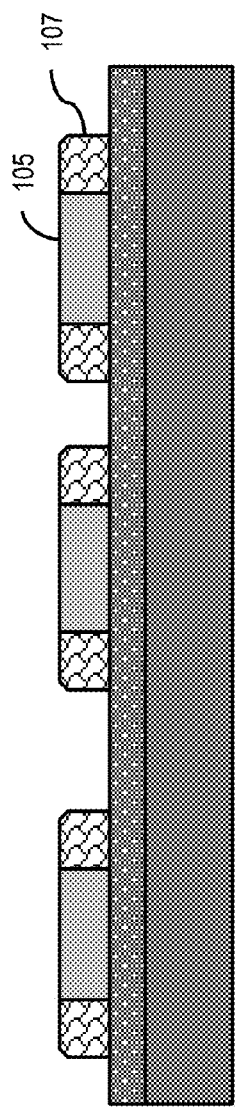
Figure 1C:
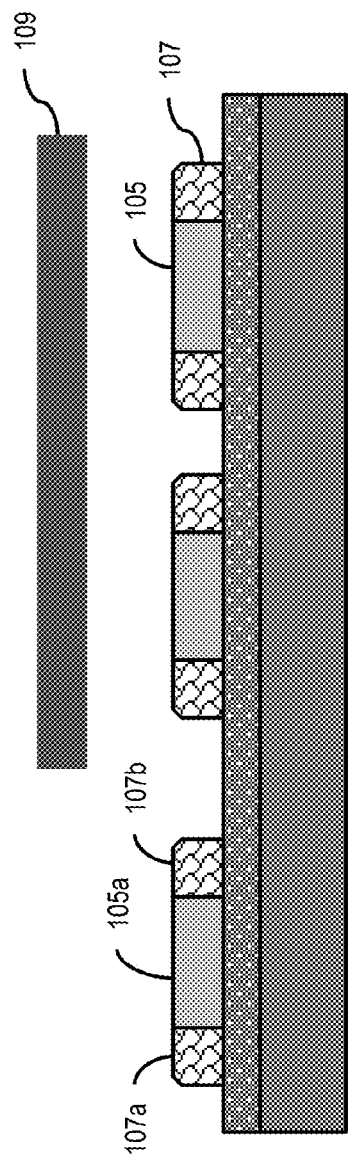
Figure 1D:
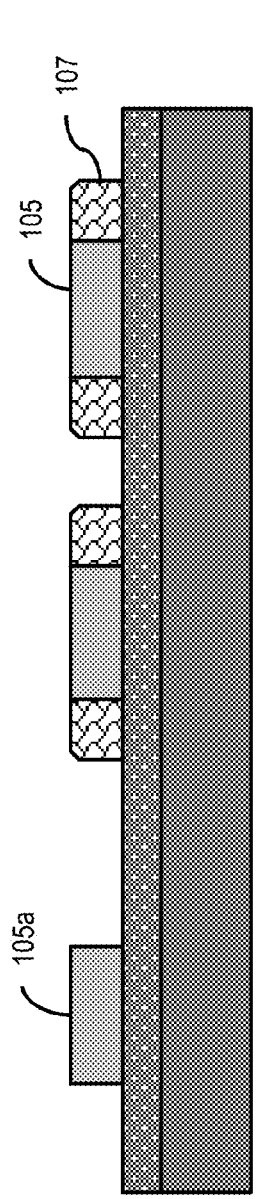

Adverting to FIG. 1B, first spacers 107 (e.g., of oxide or nitride) may be formed on opposite sides of each mandrel 105. In FIG. 1C, a block mask 109 with openings over a subset of the first spacers 107 (e.g., 107a and 107b) and corresponding mandrels 105 (e.g., 105a) may be formed so that the subset of the first spacers 107 may be removed (e.g., by etching selective to the spacers) to expose sides of the unblocked mandrels 105 (e.g., 105a), as illustrated in FIG. 1D. The block mask may include one or more openings at different locations over the mandrels and spacers. Further, the block mask may have an opening over only a portion of a mandrel and the spacer on just one side of the mandrel.

Figure 1E:
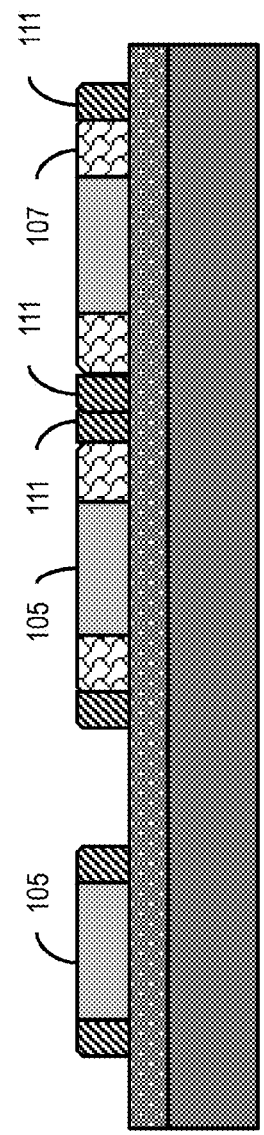

Adverting to FIG. 1E, second spacers 111 may be formed on each exposed side of the mandrels 105 and adjacent to exposed sides of the first spacers 107. In some instances, a second spacer 111 may merge with another second spacer 111.

Figure 1F:
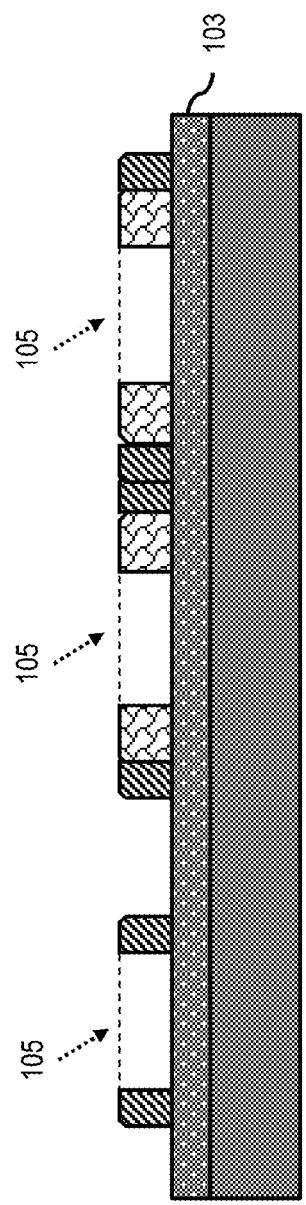
Figure 1G:
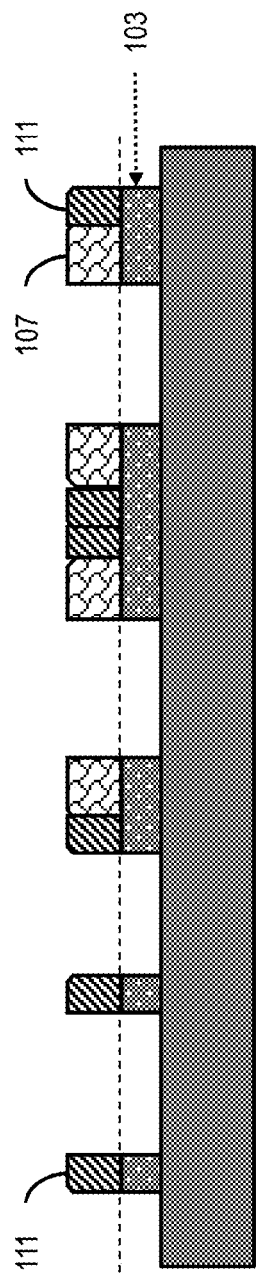
Figure 1H:
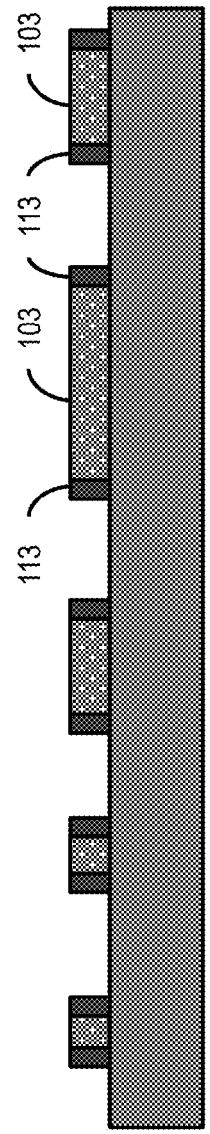

In FIG. 1F, the mandrels 105 may be removed to expose sections of the dielectric layer 103 under the mandrels. Adverting to FIG. 1G, all exposed sections of the dielectric layer 103 may be removed, but sections of the dielectric layer 103 that are protected by the spacers 107 and/or 111 remain. As illustrated in FIG. 1H, the first spacers 107 and second spacers 111 may be removed, and fin-spacers 113 may be formed on opposite sides of remaining sections of the dielectric layer 103.

Figure 1I:
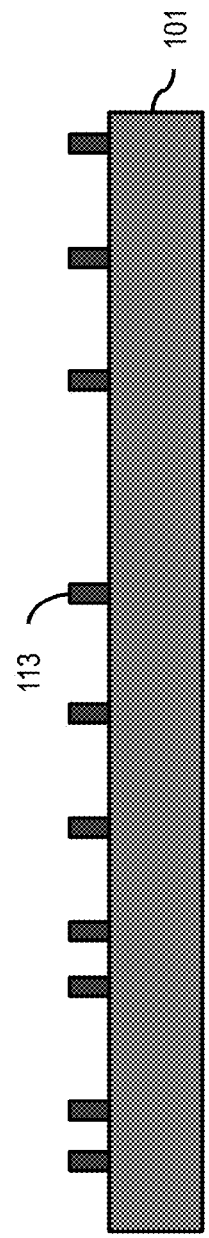

Adverting to FIG. 1I, the remaining sections of the dielectric layer 103 may be removed, while leaving the fin-spacers 113 in place, to expose sections of the Si substrate 101 under the sections of the dielectric layer 103. As illustrated in FIG. 1J, exposed sections of the Si layer 101 that are not protected by the fin-spacers 113, in spaces 115, may be removed. In FIG. 1K, the fin-spacers 113 may be removed to reveal Si fins 117.

Figures 2A, 2B:
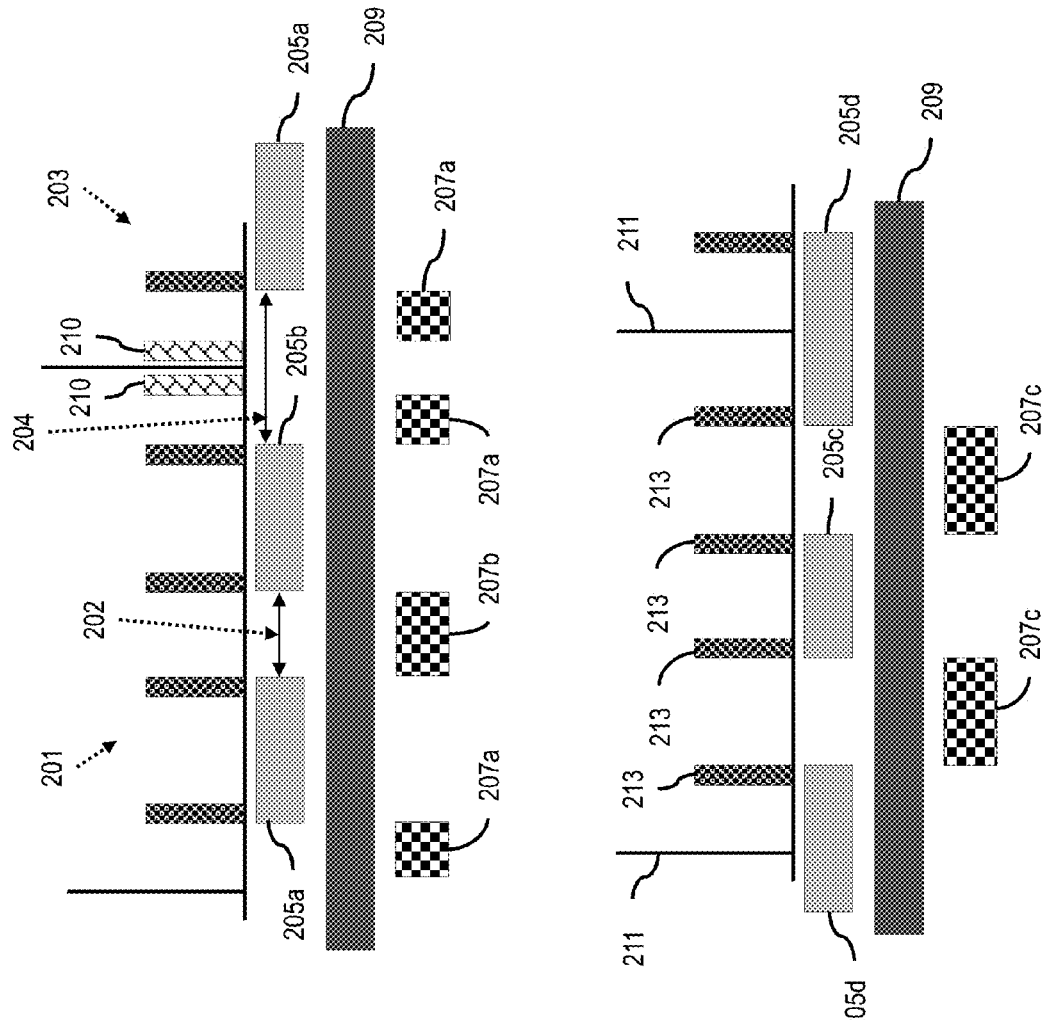
FIGS. 2A through 2P illustrate cross-sectional and top views of bit-cells and processes for generating Si fins for various memory bit-cell configurations, in accordance with an exemplary embodiment.
Figure 2C:
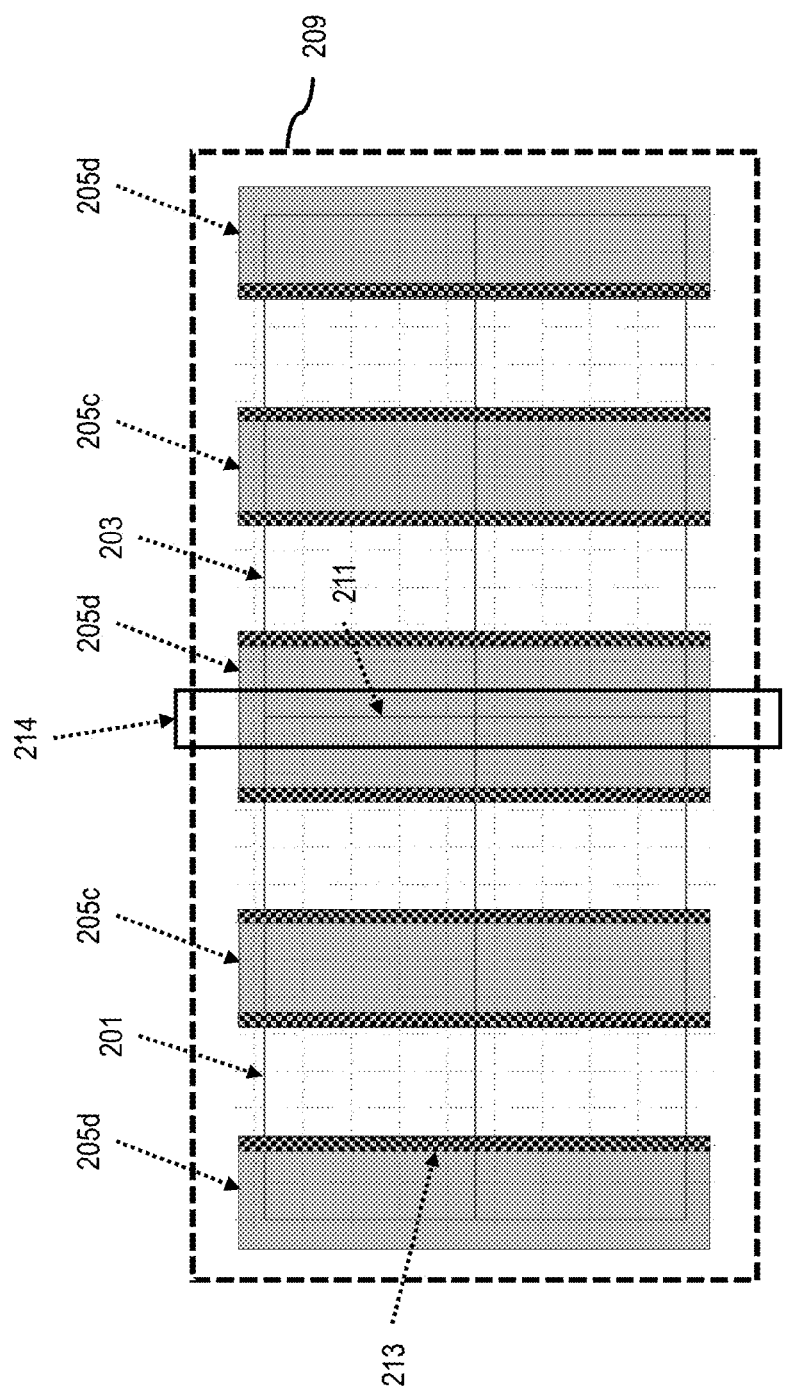
Figure 2I:
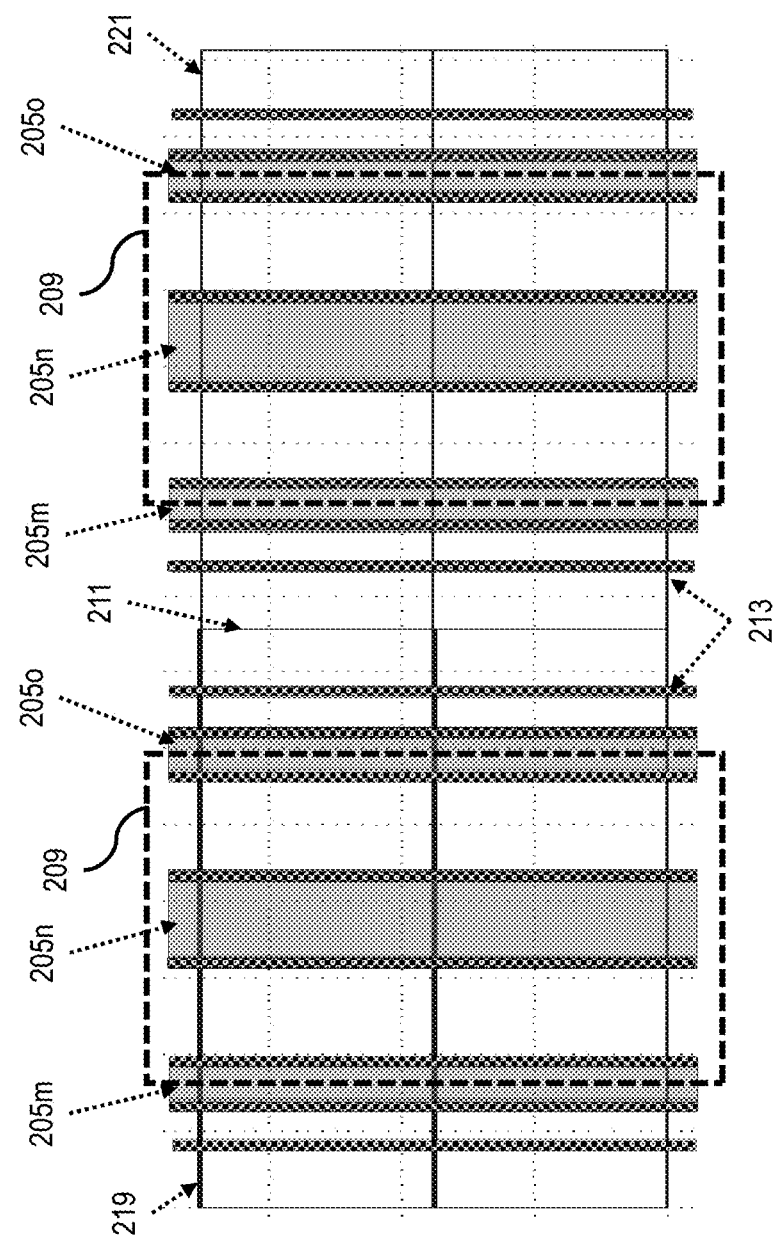
Figure 2L:
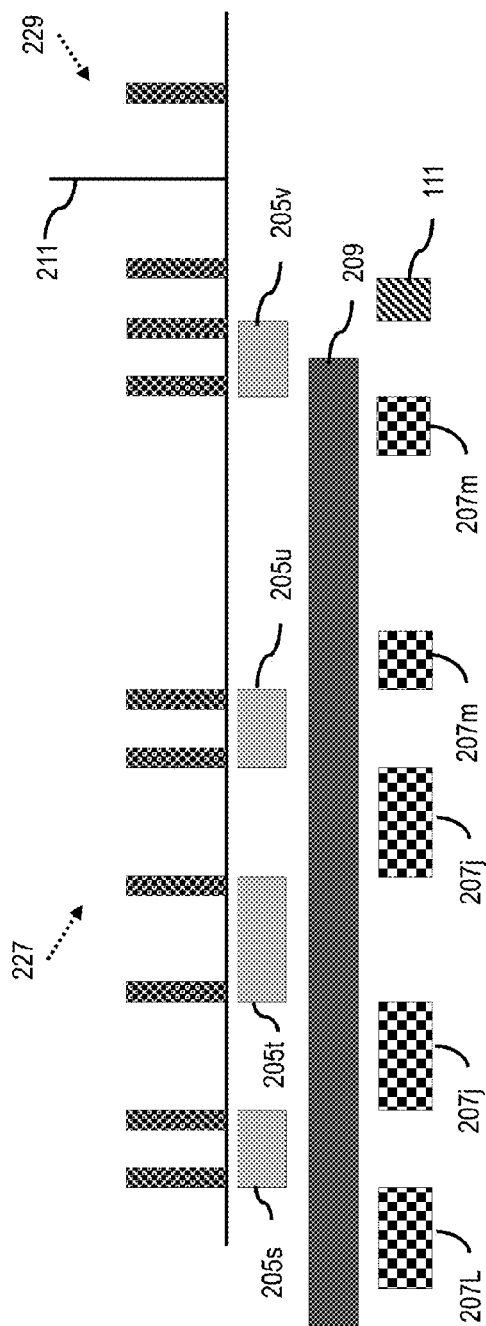
Figure 2M:
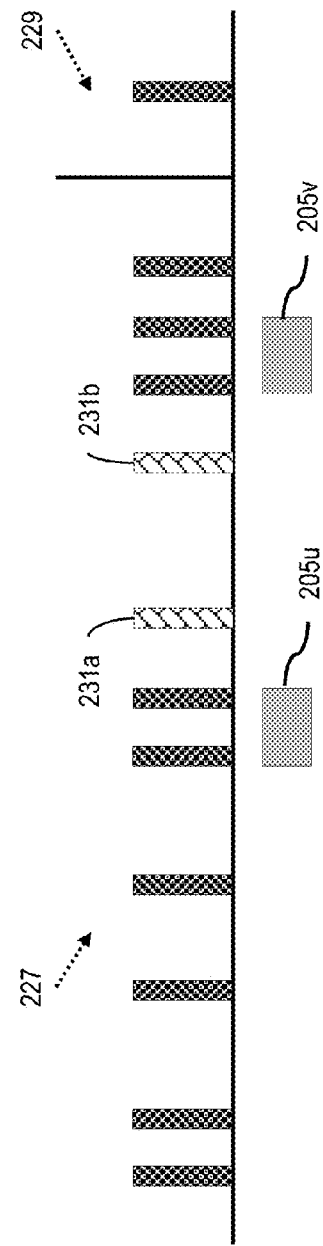
Figure 2N:
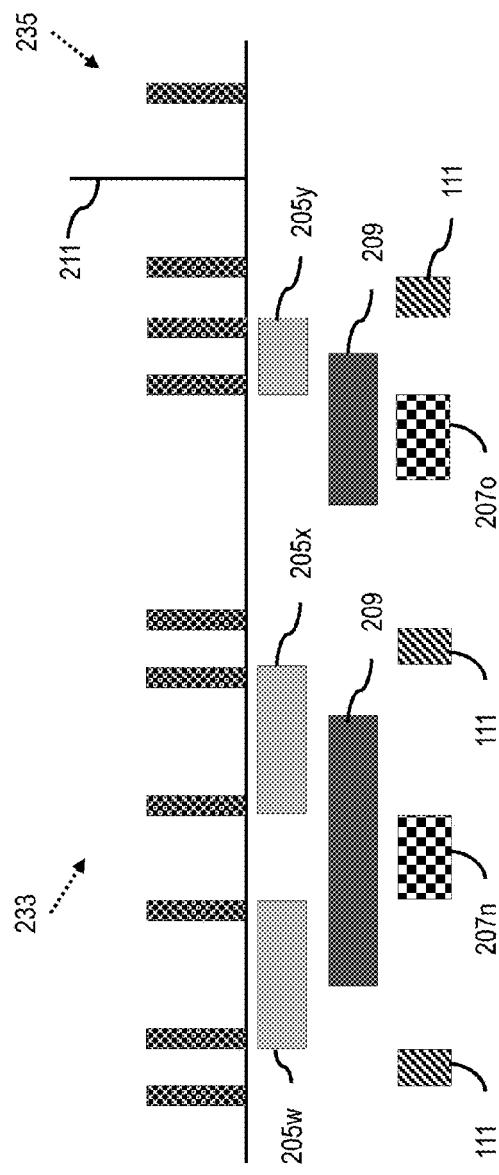
Figure 2O:
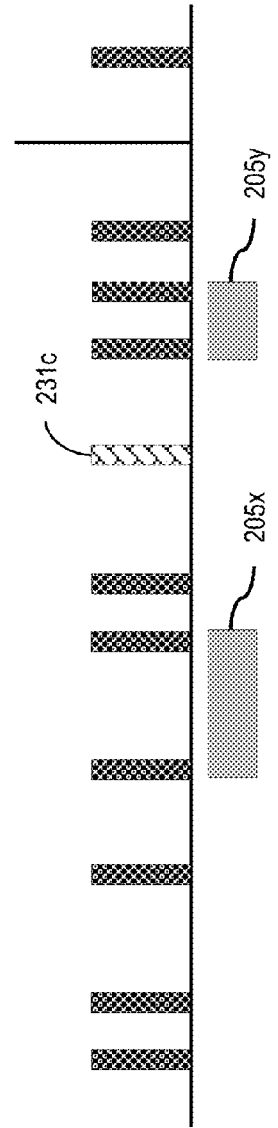
Figure 2P:
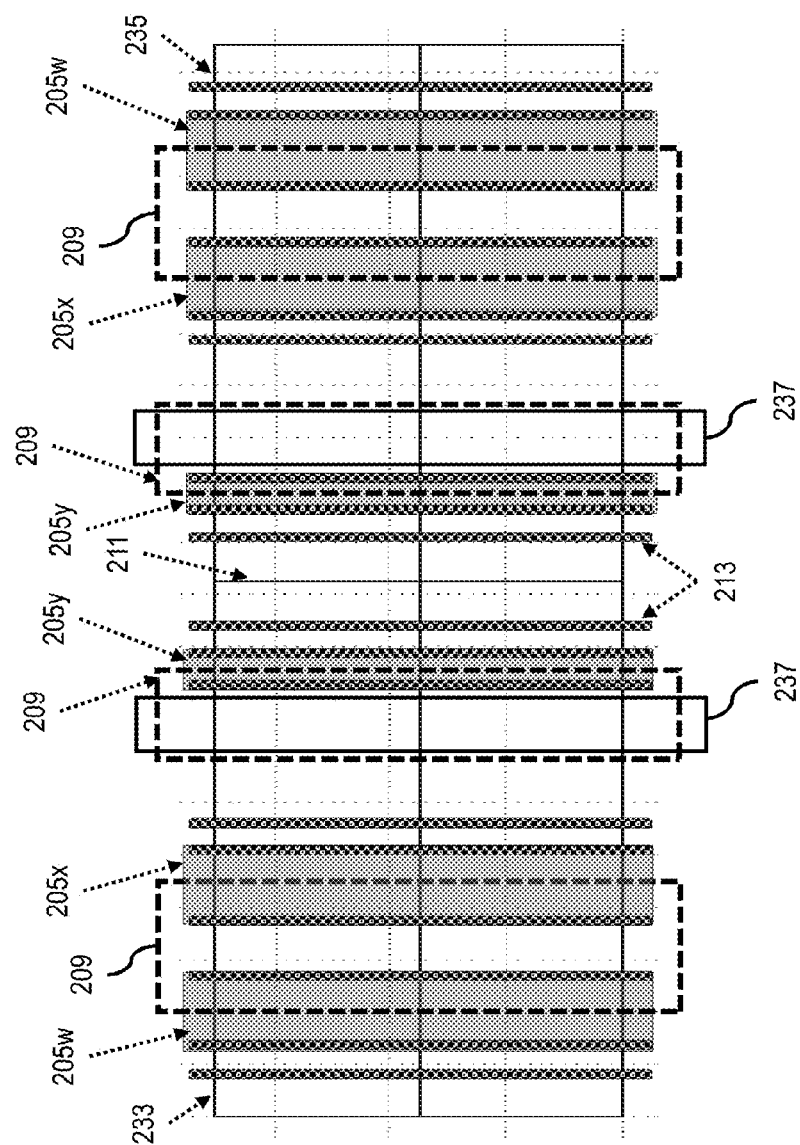

FIGS. 2A through 2P illustrate cross-sectional and top views of bit-cells and processes for generating Si fins for various memory bit-cell configurations, in accordance with an exemplary embodiment. In each of the specific examples below (which are for illustrative purposes), the fin width equals 7 nm, and the width of the second spacers equals 20 nm.

The memory bit-cell may be utilized, for example, to form an array (e.g., 2×2) of memory cells, which may be used to form a memory IC device (e.g., SRAM) or may be embedded in another IC device (e.g., a processor). In below figures a single memory bit-cell and a partial (for illustration convenience) adjacent bit-cell may be illustrated and referred to; however, the adjacent bit-cell may be described as a full memory cell in related discussions.

FIG. 2A illustrates a bit-cell 201 adjacent to another bit-cell 203, wherein a first mandrel 205a and a second mandrel 205b may be consecutively formed in each of the two adjacent bit-cells. Merged spacers (including first and second spacers) 207a and 207b may be formed on a side of each mandrel in each of the bit-cells 201 and 203. The merged spacers 207a and 207b may be formed by protecting (e.g., from removal) all of the mandrels and first spacers by a block mask 209 prior to forming the second spacers. The merged spacers 207a and 207b may have different widths, wherein the merged spacers 207b may fill a space between the first and second mandrels 205a and 205b of each bit-cell. For example, if a space 202 between the first and second mandrels, 205a and 205b, within each bit-cell is 49 nm, and a space 204 between the mandrels 205b and 205a of the adjacent bit-cells 201 and 203, respectively, is 75 nm, and the first spacers have a width greater than or equal to 4.5 nm, merged spacers 207b on adjacent mandrels, 205a and 205b, within each bit-cell will fill the space 202 and merge, whereas spacers 207a on mandrels 205b and 205a of the adjacent bit-cells 201 and 203 will not merge. Hence, the merged spacers 207a do not fill the space 204 between the second mandrel 205b of the first bit-cell 201 and the first mandrel 205a of the second bit-cell 203. As a result, dummy Si fins 210 (e.g., two) may be formed in the space between merged spacers 207a of the first bit-cell 201 and merged spacers 207a of the adjacent bit-cell 203. Alternatively, if the space 204 is the same as in the first example (e.g., 75 nm), but the first spacer width is greater than or equal to 17.5 nm, then the spacers will fill the space 204 between mandrels 205b and 205a of adjacent bit-cells 201 and 203 and merge. In that case, no dummy fins will be generated. The mandrels in both examples may have a same width, e.g. 73 nm.

The same resulting device as in the second example above may be obtained as illustrated in FIG. 2B. Adverting to FIG. 2B, a first mandrel 205c may be formed in each of the two adjacent bit-cells, 201 and 203, and a second mandrel 205d may be formed extending across a boundary 211 of each of the two adjacent bit-cells, wherein a merged spacers 207c may fill the space between the first and second mandrels 205c and 205d. For example the space between mandrels 205c and 205d may be 59 nm, the first spacers may have a width greater than or equal to 9.5 nm, the mandrels 205c may have a width of 63 nm, and the mandrels 205d may have a width of 89 nm.

FIG. 2C illustrates a top view of a layout of a 2×2 SRAM memory array including adjacent bit-cells 201 and 203 (e.g., of FIG. 2B) with the boundary 211, mandrels 205c and 205d, block-mask 209, and Si fins 213. A cut-mask 214 may be utilized to remove the dummy Si fin 210 in each bit-cell. The bit-cells in FIGS. 2A and 2B may be utilized in a 1-1-1 SRAM configuration, wherein respective Si fins 213 may be connected accordingly to pull-down (PD), pass-gate (PG), and pull-up (PU) transistors in each memory cell.

FIG. 2D illustrates a bit-cell 215 adjacent to a bit-cell 217, wherein a first mandrel 205e and a second mandrel 205f may be consecutively formed in each of the two adjacent bit-cells. Merged spacers 207d may be formed between and filling the space between adjacent mandrels 205e and 205f in each of the bit-cells 215 and 217. The first and second spacers in the merged spacers 207d may have different widths, and the first spacers may be protected (e.g., from removal) by a block mask 209 formed between the mandrels 205e and 205f prior to formation of the second spacers. Also illustrated are second spacers 111 formed on an exposed side of each mandrel 205e and 205f in each cell, wherein the first spacers may have been removed (e.g., the block mask 209 did not cover those first spacers) before forming the second spacers 111. For example, the mandrel width may be 73 nm, the space between mandrels within a bit-cell may be 49 nm, the space between mandrels of adjacent bit-cells may be 129 nm, and the first spacer width may be greater than or equal to 4.5 nm.

The same resulting structure as in FIG. 2D may be obtained as illustrated in FIG. 2E. Adverting to FIG. 2E, first, 205g, second, 205h, and third, 205i, mandrels may be consecutively formed in each of the two adjacent bit-cells 215 and 217, wherein a space between the third mandrel 205i of the first bit-cell 215 and the first mandrel 205g of the second bit-cell 217 is greater than each space between the first, 205g, and second, 205h, mandrels and between the second, 205h, and third, 205i, mandrels of each bit-cell. The merged spacers 207e and 207f fill each space between mandrels within each bit-cell and a space between the third mandrel 205i of the first bit-cell 215 and a first mandrel 205g of the second bit-cell 217. For example, mandrels 205g and 205i may have a width of 34 nm, mandrel 205h may have a width of 63 nm, the spaces between mandrels within each bit-cell may be 59 nm, the space between mandrels of adjacent bit-cells may be 75 nm, and the first spacer width may be greater than or equal to 17.5 nm.

FIG. 2F illustrates a top view of a layout of a 2×2 SRAM memory array including adjacent bit-cells 215 and 217 (e.g., of FIG. 2D) with boundary 211, mandrels 205e and 205d, block-mask 209, and Si fins 213. The bit-cells in FIGS. 2D and 2E may be utilized in a 1-2-2 SRAM configuration, wherein respective Si fins 213 may be connected accordingly to pull-down (PD), pass-gate (PG), and pull-up (PU) transistors in each memory cell.

FIG. 2G illustrates first, 205j, and second, 205k, mandrels in each of the two adjacent bit-cells 219 and 221, and a third mandrel 205L extending over a boundary 211 between the two adjacent bit-cells. A block mask 209 may be formed covering a space between the first, 205j, and second, 205k, mandrels of each bit-cell protecting first spacers between the mandrels 205j and 205k. A merged spacers 207g may fill a space between the mandrels 205j and 205k. Second spacers 111 may be formed on exposed sides of the first and second mandrels, 205j and 205k, and the third mandrels 205L. For example, the mandrels 205j and 205k may have a width of 73 nm, and the mandrel 205L may have a width of 35 nm. If the space between the first and second mandrels, 205j and 205k, within each bit-cell is 49 nm, and the space between the third mandrel 205L and an adjacent mandrel (e.g., 205k in bit-cell 219 or 205j in bit-cell 221) is 74 nm, and the first spacers have a width greater than or equal to 4.5 nm, then the second spacers 111 adjacent to the boundary 211 in each bit-cell may not merge, wherein dummy Si fins may be formed on opposite sides of the boundary 211.

As illustrated in FIG. 2H, first, 205m, second, 205n, and third, 205o, mandrels may be formed in each of the two adjacent bit-cells 219 and 221. A block mask 209 may be formed covering spaces between the first, 205m, and second, 205n, mandrels and between the second, 205n, and third, 205o, mandrels of each bit-cell 219 and 221. Merged spacers 207h may be formed to fill the spaces between the first and second mandrels and between the second and third mandrels of each bit-cell. Also, second spacers 111 may be formed on an exposed side of each of the first and third mandrels, 205m and 205o. For example, the mandrels 205m and 205o may have a width of 34 nm, mandrel 205n may have a width of 63 nm, the spaces between mandrels within each bit-cell may be 59 nm, the space between mandrels of adjacent bit-cells may be 129 nm, and the first spacer width may be greater than or equal to 9.5 nm.

FIG. 2I illustrates a top view of a layout of a 2×2 SRAM memory array including adjacent bit-cells 219 and 221 (e.g., of FIG. 2H) with boundary 211, mandrels 205m, 205n, and 205o, block-mask 209, and Si fins 213. The bit-cells in FIG. 2G or 2H may be utilized in a 1-3-3 SRAM configuration, wherein respective Si fins 213 may be connected accordingly to pull-down (PD), pass-gate (PG), and pull-up (PU) transistors in each memory cell.

As illustrated in FIG. 2J, first, 205p, second, 205q, and third, 205r, mandrels may be formed consecutively in the first bit-cell 223 and third, 205r, second, 205q, and first, 205p mandrels in the second bit-cell 225. A block mask 209 may be formed covering spaces between the first, 205p, and second, 205q, mandrels in each bit-cell. A merged spacer 207i may be formed filling the spaces between the first and second mandrels of each bit-cell. Also, second spacers 111 may be formed on an exposed side of each of the first, second, and third mandrels in each bit-cell. For example, the mandrels 205p and 205q may have a width of 73 nm, mandrel 205r may have a width of 34 nm, the spaces between mandrels 205p and 205q within each bit-cell may be 49 nm, the spaces between mandrels 205q and 205r within each bit-cell may be 182 nm, the space between mandrels of adjacent bit-cells may be 75 nm. If the first spacers 211 have a width greater than or equal to 4.5 nm, the second spacers 111 adjacent to the boundary 211 in each bit-cell may not merge, wherein dummy Si fins may be formed on opposite sides of the boundary 211.

As illustrated in FIG. 2K, first, 205s, second, 205t, third, 205u, and fourth, 205v, mandrels may be formed consecutively in the first bit-cell 223 and fourth, 205v, third, 205u, second, 205t, and first, 205s mandrels in the second bit-cell 225. A block mask 209 may be formed with an opening over a side of the fourth mandrel, 205v, adjacent a boundary 211 between the two adjacent bit-cells. Merged spacers 207j may fill spaces between the first and second mandrels, and between the second and third mandrels. Merged spacers 207k may fill spaces between the third and fourth mandrels of each bit-cell. Also, merged spacers 207L may be formed on an exposed side of the first mandrels 205s in each bit-cell. Additionally, a second spacer 111 may be formed on an exposed side of the fourth mandrels 205v. For example, the mandrels 205s, 205u, and 205v may have a width of 34 nm, mandrel 205t may have a width of 63 nm, the spaces between mandrels 205s and 205t, and between mandrels 205t and 205u within each bit-cell may be 59 nm, the space between mandrels 205u and 205v within each bit-cell may be 128 nm, the space between mandrels of adjacent bit-cells may be 129 nm. The first spacers may have a width greater than or equal to 44 nm.

As illustrated in FIG. 2L, first, 205s, second, 205t, third, 205u, and fourth, 205v, mandrels may be formed consecutively in the first bit-cell 227 and fourth, 205v, third, 205u, second, 205t, and first, 205s mandrels consecutively in the second bit-cell 229. A block mask 209 may be formed with an opening over a side of the fourth mandrel, 205v, adjacent a boundary 211 between the two adjacent bit-cells. Merged spacers 207j may fill spaces between the first and second mandrels, and between the second and third mandrels in each bit-cell. Merged spacers 207m may be formed in spaces between the third and fourth mandrels, 205u and 205v, of each bit-cell, but do not fill in the spaces between the third and fourth mandrels of each bit-cell. Also, merged spacers 207L may be formed on an exposed side of the first mandrels 205s. Additionally, a second spacer 111 may be formed on an exposed side of each of the fourth mandrels 205v. For example, the mandrels 205s, 205u, and 205v may have a width of 34 nm, mandrel 205t may have a width of 63 nm, the spaces between mandrels 205s and 205t, and between mandrels 205t and 205u within each bit-cell may be 59 nm, the space between mandrels 205u and 205v within each bit-cell may be 128 nm, the space between mandrels of adjacent bit-cells may be 129 nm, the first spacers may have a width equal to 18 nm. As illustrated in FIG. 2M, two dummy Si fins, 231a and 231b, are formed in the space between the third and fourth mandrels, 205u and 205v, of each bit-cell, wherein the spaces between the dummy Si fin 231a and the mandrel 205u, and between the dummy Si fin 231b and the mandrel 205v may be 38 nm. A cut-mask may be utilized to remove the two dummy Si fins 231 in the bit-cells.

Adverting to FIG. 2N, first, 205w, second, 205x, and third, 205y mandrels may be formed consecutively in the first bit-cell 233 and third, 205y, second, 205x, and first, 205w mandrels consecutively in the second bit-cell 235. A block mask 209 may be formed over a space between the first and second mandrels, 205w and 205x, and over a side of the third mandrel, 205y, remote from a boundary 211 between the two adjacent bit-cells. A merged spacers 207n may fill only the space between the first and second mandrels, 205w and 205x, of each bit-cell. Also, a merged spacers 207o may be formed on a side of the third mandrel 205y opposing the second mandrel 205x in each bit-cell; however, the spacer 207o does not fill the space between the second mandrel, 205x, and third mandrel, 205y of each bit-cell. Additionally, second spacers 111 may be formed on an exposed side of each of the first, second, and third mandrels, 205w, 205x, and 205y in each of the bit-cells. For example, the mandrels 205w and 205x may have a width of 73 nm, mandrel 205y may have a width of 34 nm, the space between mandrels 205w and 205x within each bit-cell may be 49 nm, the space between mandrels 205x and 205y within each bit-cell may be 128 to 155 nm, the space between mandrels of adjacent bit-cells may be 129 nm, the first spacers may have a width equal to 10 nm. As illustrated in FIG. 2O, a dummy Si fin 231c may be formed in the space between the second and third mandrels, 205x and 205y, of each bit-cell, wherein the space between the dummy Si fin 231c and the mandrel 205y may be 30 nm.

FIG. 2P illustrates a top view of a layout of a 2×2 SRAM memory array including adjacent bit-cells 233 and 235 (e.g., of FIG. 2N) with boundary 211, mandrels 205w, 205x, and 205y, block-masks 209, and Si fins 213. A cut-mask 237 may be utilized to remove the dummy Si fin(s) 231 in each bit-cell. The bit-cells in FIG. 2J, 2K, 2L, or 2N may be utilized in a 1-2-2+3 SRAM configuration, wherein respective Si fins 213 may be connected accordingly to pull-down (PD), pass-gate (PG), and pull-up (PU) write/read transistors in each memory cell.

The embodiments of the present disclosure can achieve several technical effects including utilizing efficient processes to form and utilize merged spacers in fin generation. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing mandrels separated from each other across two adjacent bit-cells on an upper surface of a dielectric layer on an upper surface of a silicon (Si) layer;
forming first spacers on opposite sides of each mandrel;
forming second spacers on exposed sides of the first spacers;
removing the mandrels;
removing exposed sections of the dielectric layer;
removing the first and second spacers;
forming fin-spacers on opposite sides of remaining sections of the dielectric layer;
removing the remaining sections of the dielectric layer;
removing exposed sections of the Si layer; and
removing the fin-spacers to reveal Si fins.

2. The method according to claim 1, comprising:
providing consecutively first and second mandrels in each of the two adjacent bit-cells,
wherein the first and second spacers fill a space between the first and second mandrels of each bit-cell.

3. The method according to claim 2, wherein two dummy Si fins are formed in a space between the second mandrel of the first bit-cell and first mandrel of the adjacent bit-cell, the method further comprises:
utilizing a cut-mask to remove the two dummy Si fins.

4. The method according to claim 1, comprising:
providing a first mandrel in each of the two adjacent bit-cells and a second mandrel extending across a boundary of the two adjacent bit-cells; and
forming the first and second spacers filling a space between the first and second mandrels.

5. The method according to claim 1, comprising:
providing consecutively first, second, and third mandrels in each of the two adjacent bit-cells,
wherein a space between the third mandrel of the first bit-cell and the first mandrel of the second bit-cell is greater than each space between the first and second mandrels and between the second and third mandrels of each bit-cell, and wherein the first and second spacers fill each space.

6. A method comprising:
providing mandrels separated from each other across two adjacent bit-cells on an upper surface of a dielectric layer on an upper surface of a silicon (Si) layer;
forming first spacers on opposite sides of each mandrel;
removing a subset of the first spacers, exposing sides of a subset of the mandrels;
forming second spacers on each exposed side of the subset of the mandrels and adjacent to exposed sides of the first spacers;
removing the mandrels;
removing exposed sections of the dielectric layer;
removing the first and second spacers;
forming fin-spacers on opposite sides of remaining sections of the dielectric layer;
removing the remaining sections of the dielectric layer;
removing exposed sections of the Si layer; and
removing the fin-spacers to reveal Si fins.

7. The method according to claim 6, comprising:
removing the subset of spacers by forming a block mask with openings over the subset of spacers.

8. The method according to claim 7, comprising:
providing first and second mandrels in each of the two adjacent bit-cells; and
forming the block mask covering a space between the first and second mandrels of each bit-cell.

9. The method according to claim 7, comprising:
providing first and second mandrels in each of the two adjacent bit-cells and a third mandrel extending over a boundary between the two adjacent bit-cells;
forming the block mask covering a space between the first and second mandrels of each bit-cell; and
forming the first and second spacers filling a space between the first and second mandrels.

10. The method according to claim 9, wherein dummy Si fins are formed on opposite sides of the boundary.

11. The method according to claim 7, comprising:
providing consecutively first, second, and third mandrels in each of the two adjacent bit-cells;
forming the block mask covering spaces between the first and second mandrels and between the second and third mandrels of each bit-cell; and
forming the first and second spacers filling the spaces between the first and second mandrels and between the second and third mandrels of each bit-cell.

12. The method according to claim 7, comprising:
providing consecutively first, second, and third mandrels in the first bit-cell and third, second, and first mandrels in the second bit-cell;
forming the block mask covering a space between the first and second mandrels of each bit-cell; and
forming the first and second spacers filling the spaces between the first and second mandrels of each bit-cell.

13. The method according to claim 12, wherein:
two dummy Si fins are formed on opposite sides of a boundary between the two adjacent bit-cells.

14. The method according to claim 7, comprising:
providing consecutively first second, third, and fourth mandrels in the first bit-cell and fourth, third, second, and first mandrels in the second bit-cell;
forming the block mask with an opening over a side of the fourth mandrel adjacent a boundary between the two adjacent bit-cells; and
forming the first and second spacers filling spaces between the first and second mandrels, between the second and third mandrels, and between the third and fourth mandrels of each bit-cell.

15. The method according to claim 7, comprising:
providing consecutively first, second, third, and fourth mandrels in the first bit-cell and fourth, third, second, and first mandrels in the second bit-cell;
forming the block mask with an opening over a side of the fourth mandrel adjacent a boundary between the two adjacent bit-cells; and
forming the first and second spacers filling spaces between the first and second mandrels and between the second and third mandrels.

16. The method according to claim 15, wherein:
two dummy Si fins are formed in the space between the third and fourth mandrels of each bit-cell.

17. The method according to claim 16, further comprising:
utilizing a cut-mask to remove the two dummy Si fins in the space between the third and fourth mandrels of each bit-cell.

18. The method according to claim 7, comprising:
providing consecutively first, second, and third mandrels in the first bit-cell and third, second, and first mandrels in the second bit-cell;
forming the block mask over a space between the first and second mandrels and over a side of the third mandrel remote from a boundary between the two adjacent bit-cells; and
forming the first and second spacers filling only the space between the first and second mandrels of each bit-cell.

19. The method according to claim 18, wherein a dummy Si fin is formed in a space between the second mandrel and the third mandrel of each bit-cell, the method further comprising:
utilizing a cut-mask to remove the dummy Si fin in the space between the second mandrel and the third mandrel of each bit-cell.

20. A method comprising:
providing mandrels separated from each other across two adjacent bit-cells on an upper surface of a dielectric layer on an upper surface of a silicon (Si) layer;
forming first spacers on opposite sides of each mandrel;
forming a block mask with openings over a subset of the first spacers;
removing the subset of the first spacers, exposing sides of a subset of the mandrels;
forming second spacers on each exposed side of the subset of the mandrels and adjacent to exposed sides of the first spacers;
removing the mandrels;
removing exposed sections of the dielectric layer;
removing the first and second spacers;
forming fin-spacers on opposite sides of remaining sections of the dielectric layer;
removing the remaining sections of the dielectric layer;
removing exposed sections of the Si layer;
removing the fin-spacers to reveal Si fins; and
utilizing a cut-mask to remove dummy Si fins formed in each bit-cell.

* * * * *